United States Patent
Yamauchi et al.

(10) Patent No.: US 9,947,410 B2
(45) Date of Patent: Apr. 17, 2018

(54) NON-VOLATILE SEMICONDUCTOR MEMORY DEVICE

(71) Applicant: Winbond Electronics Corp., Taichung (TW)

(72) Inventors: Kazuki Yamauchi, Taichung (TW); Naoaki Sudo, Taichung (TW)

(73) Assignee: Winbound Electronics Corp., Taichung (TW)

( * ) Notice: Subject to any disclaimer, the term of this patent is extended or adjusted under 35 U.S.C. 154(b) by 0 days.

(21) Appl. No.: 15/182,593

(22) Filed: Jun. 15, 2016

(65) Prior Publication Data
US 2017/0221567 A1 Aug. 3, 2017

(30) Foreign Application Priority Data
Feb. 2, 2016 (JP) .................. 2016-017591

(51) Int. Cl.
*G11C 16/10* (2006.01)
*G11C 29/52* (2006.01)
(Continued)

(52) U.S. Cl.
CPC .......... *G11C 16/10* (2013.01); *G06F 11/1068* (2013.01); *G11C 16/30* (2013.01);
(Continued)

(58) Field of Classification Search
CPC ..... G11C 16/10; G11C 16/30; G11C 16/3459; G11C 29/52; G06F 11/1068
See application file for complete search history.

(56) References Cited

U.S. PATENT DOCUMENTS

2006/0245269 A1* 11/2006 Martines ............ G11C 16/3454
365/189.04
2007/0297236 A1 12/2007 Tokiwa
(Continued)

FOREIGN PATENT DOCUMENTS

JP 2005353242 12/2005
JP 2006134482 5/2006
(Continued)

OTHER PUBLICATIONS

"Office Action of Taiwan Counterpart Application," dated May 31, 2017, p. 1-6.
(Continued)

*Primary Examiner* — Kyle Vallecillo
(74) *Attorney, Agent, or Firm* — JCIPRNET

(57) ABSTRACT

A non-volatile semiconductor memory device is provided. A determination circuit 200 used to determine the suspected qualification is connected with a plurality of page buffer/sensing circuits 170 via wirings PB_UP, PB_MG, PB_DIS. The page buffer/sensing circuit 170 includes a transistor Q2 in which a reference current Iref flows through a transistor Q1 when the programming verification is unqualified. The determination circuit 200 includes a comparator CMP, a voltage of the wiring PB_UP is supplied to one of input terminals of the comparator CMP, and a reference voltage Vref is supplied to another one of the input terminals. The reference voltage Vref is generated by a reference current (Iref*N) whose amount is corresponding to an unqualified bit number (N) which is determined to be suspectedly qualified.

9 Claims, 13 Drawing Sheets

(51) Int. Cl.
*G06F 11/10* (2006.01)
*G11C 16/34* (2006.01)
*G11C 16/30* (2006.01)

(52) U.S. Cl.
CPC .......... *G11C 16/3459* (2013.01); *G11C 29/52* (2013.01); *G11C 2211/5621* (2013.01)

(56) References Cited

U.S. PATENT DOCUMENTS

| | | | |
|---|---|---|---|
| 2011/0141817 | A1 | 6/2011 | Takagiwa |
| 2011/0205823 | A1* | 8/2011 | Hemink .................... G11C 7/04 365/211 |
| 2011/0286265 | A1* | 11/2011 | Mokhlesi ............ G11C 11/5628 365/185.02 |
| 2013/0088919 | A1 | 4/2013 | Kim |
| 2014/0198567 | A1* | 7/2014 | Mokhlesi ............ G11C 11/5642 365/185.03 |
| 2014/0211561 | A1* | 7/2014 | Li ....................... G11C 11/5628 365/185.03 |
| 2014/0215122 | A1* | 7/2014 | Li ....................... G06F 11/1666 711/103 |
| 2015/0262672 | A1 | 9/2015 | Fukuda |
| 2016/0118134 | A1* | 4/2016 | Dutta ................. G11C 16/3459 365/185.21 |
| 2016/0118135 | A1* | 4/2016 | Dutta ................. G11C 16/3459 365/185.03 |

FOREIGN PATENT DOCUMENTS

| | | |
|---|---|---|
| JP | 2008004178 | 1/2008 |
| JP | 2008165805 | 7/2008 |
| JP | 2010079486 | 4/2010 |
| JP | 2010152989 | 7/2010 |
| KR | 20060046437 | 5/2006 |
| KR | 20090098844 | 9/2009 |
| TW | 1410972 | 10/2013 |

OTHER PUBLICATIONS

"Search Report of Europe Counterpart Application", dated Jul. 10, 2017, p. 1-8.

"Office Action of Korea Counterpart Application," with English translation thereof, dated Apr. 19, 2017, p. 1-7.

* cited by examiner

NON-VOLATILE SEMICONDUCTOR MEMORY DEVICE

CROSS-REFERENCE TO RELATED APPLICATION

This application claims the priority benefit of Japan application serial no. 2016-017591, filed on Feb. 2, 2016. The entirety of the above-mentioned patent application is hereby incorporated by reference herein and made a part of this specification.

BACKGROUND OF THE INVENTION

1. Field of the Invention

The invention relates to a non-volatile semiconductor storage device, and particularly relates to programming of an NAND flash memory.

2. Description of Related Art

In the NAND memory, data programming or erasing is repetitively performed. Due to the deterioration of the charge maintaining characteristic resulting from the deterioration of the tunnel insulating film or a change in threshold value resulting from the charges captured by the tunnel insulating film, a bit error may occur. Patent Document 1 (Japanese Patent Publication No. 2010-152989) discloses mounting an error checking correction (ECC) circuit as a solution against such bit error. In addition, Patent Document 2 (Japanese Patent Publication No. 2008-165805) discloses an error correction solution for multi-bit data in an NAND flash memory where a memory cell storing multi-bit data. Furthermore, Patent Document 3 (Japanese Patent Publication No. 2010-79486) discloses a flash memory in which a physical block whose number of corrected errors is higher than a threshold value is labeled as a warning block and registered in a table. In addition, the priority of the warning block is lowered in data writing.

Issue to be Solved by the Invention

In an NAND flash memory where an ECC circuit is mounted in a chip, when data to be programmed input from an external input/output terminal are loaded to a page buffer/sensing circuit, the data to be programmed are transmitted to the ECC circuit. An ECC circuit 130 performs computation on the data to be programmed, generates an error correction symbol for error checking and correction, and writes the error correction symbol back to a predetermined area of the page buffer/sensing circuit. In addition, a selected page of a memory array performs programming on the data to be programmed and the error correction symbol held by the page buffer/sensing circuit.

FIG. 1 is a flowchart illustrating a conventional programming operation. A voltage corresponding to the data being programmed is set to the bit line, and a programming pulse is applied to the selected page (S10). Then, a programming verification to the selected page is performed (S20), so as to determine whether programming of all the memory cells of the selected page is qualified (S30). If the programming is qualified, the programming is completed. Alternatively, if there is an unqualified memory cell, whether the number of times of applying the programming pulse reaches NMAX is determined (S40). Here, NMAX refers to the maximum duration permissible in the programming or the maximum number of times permissible to apply the programming pulse. When NMAX is reached, an external controller is informed of a state of programming failure, and the block is treated as a bad block for further management. If NMAX is not reached, a programming pulse having a step voltage greater than the previous programming pulse by $\Delta V$ is generated based on incremental step program pulse (ISPP) (S50), so as to apply the programming pulse to the selected page.

In a flash memory without using the ECC function provided in the external controller, for example, or a flash memory not having the ECC function, the programming verification is qualified under the premise that all the bits are qualified. Alternatively, for a flash memory using the ECC function provided in the external controller, for example, or a flash memory having the ECC function in the chip, even if some unqualified bits (memory cells whose programming of "0" is not qualified) are present, the unqualified bits may still be repaired by ECC to be determined to be suspectedly qualified. For example, if ECC is able to perform error checking and correction for m bits, in theory, a maximum of m bits of unqualified bits may be repaired. When reading the selected page, the unqualified bits included in the selected page are detected as errors, and the data are corrected. By determining to be suspectedly qualified, programming failures or bad blocks are reduced, and the yield rate is increased. Thus, the programming interference may be reduced by suppressing the number of times of applying the programming pulse.

However, the programming verification in the conventional flash memory is performed by a circuit configured to determine all the bits. Since such circuit determines whether all the bits of the selected page are qualified, the circuit is unable to derive the determination of suspectedly qualified. FIG. 2 is a view illustrating a conventional circuit configured to determine all the bits. For example, when the size of the page buffer/sensing circuit is 2 kB, a verification transistor supplied with nodes SLS_0, SLS_1, SLS_2, . . . , SLS_2048×8 of a latch circuit is connected in parallel between a verification and determination line VL and a node N, and a transistor that enables the programming verification (JUDGEON at a high potential (H potential)) is further connected between the node N and GND. During the programming verification, a voltage at the H potential is supplied to the verification and determination VL. When all the bits of the selected page are qualified, all the nodes SLS_0, SLS_1, SLS_2, . . . , SLS_2048×8 of the latch circuit are at a low potential (L potential), and the verification and determination line VL is maintained at the H potential. However, even when only one of the bits is unqualified, one of the nodes SLS_0, SLS_1, SLS_2, . . . , SLS 2048×8 becomes the H potential, the corresponding verification transistor is turned on, and the verification and determination line VL is changed to the L potential. Thus, the circuit configured to all bits is unable to come to the determination of suspectedly qualified.

SUMMARY OF THE INVENTION

The invention provides a non-volatile semiconductor storage device capable of making a determination of suspectedly qualified.

Technical Means for Solving Issue

A non-volatile semiconductor storage device according to the invention includes a memory array, a plurality of data holding circuits, and a determination circuit. In the data holding circuits, each of the data holding circuits includes a circuit connected to the memory array through a bit line and holding data to be programmed in a selected page, and an output circuit outputting whether a verification is qualified or not in a programming verification. The determination circuit is connected to the output circuit of each of the data holding circuits, and determines whether verification results of the plurality of data holding circuits match a permissible number of unqualified bits. In addition, the determination circuit includes a first circuit, a second circuit, and a comparison circuit. The first circuit generates a detection voltage corresponding to whether the verifications of the data holding circuits are qualified or not. The second circuit generates a reference voltage. The comparison circuit compares the detection voltage with the reference voltage, and outputs a signal indicating whether the verification results of the data holding circuits are the permissible number of unqualified bits.

According to an embodiment of the invention, the second circuit generates the reference voltage corresponding to the permissible number of unqualified bits. According to an embodiment of the invention, the second circuit generates the reference voltage based on reference currents corresponding to the permissible number of unqualified bits. According to an embodiment of the invention, the second circuit includes a plurality of transistors that the reference current flows through, and the second circuit selects the number of operable transistors of the transistors in correspondence with the permissible number of unqualified bits. According to an embodiment of the invention, the output circuit of the data holding circuit includes a transistor that a current equivalent to the reference current of the second circuit when the result of the verification is unqualified flows through, and the first circuit generates the detection voltage based on the reference currents corresponding to the number of unqualified bits. According to an embodiment of the invention, the second circuit generates the reference voltage with the reference currents in a predetermined amount, and the first circuit generates the detection voltage based on the reference currents in an amount less than the predetermined amount. According to an embodiment of the invention, the first circuit includes a supply circuit, and the supply circuit supplies the reference currents in an amount corresponding to the permissible number of unqualified bits, and the detection voltage generated by the first circuit is at a value corresponding to the reference currents supplied by the supply circuit. According to an embodiment of the invention, the supply circuit includes a plurality of transistors that the reference current flows through, and the supply circuit selects the number of operable transistors of the transistors in correspondence with the permissible number of unqualified bits. According to an embodiment of the invention, the permissible number of unqualified bits is determined in correspondence with the number of bits that are able to be repaired by an error checking and correction member. According to an embodiment of the invention, when the error checking and correction member operates using a sector of the selected page as a unit, the determination circuit is connected to the data holding circuits using sector as a unit.

Effect of Invention

According to the embodiments of the invention, the determination circuit determining whether the verification results of the data holding circuits are the permissible number of unqualified bits is set. Thus, in addition to the determination for all the bits, the determination of suspectedly qualified is also able to be made.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
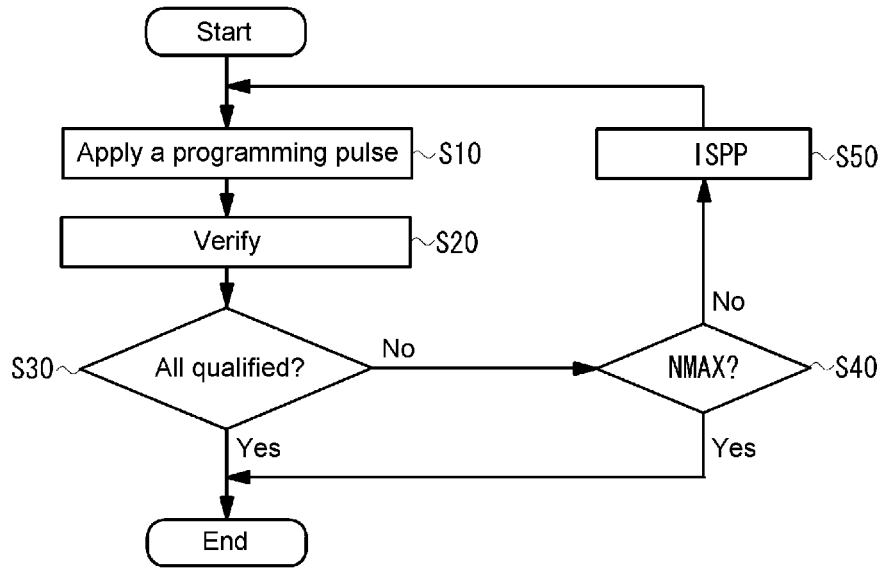
FIG. 1 is a flowchart illustrating performing a programming operation in a conventional flash memory.
Figure 2:
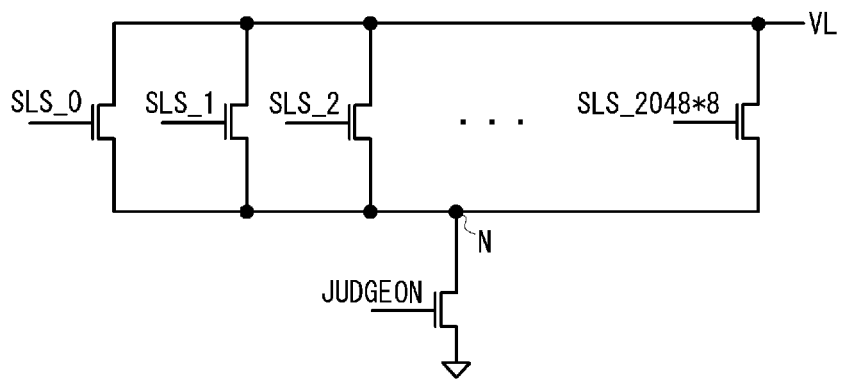
FIG. 2 is a view illustrating a circuit for determining all the bits in a conventional programming verification process.

Reference will now be made in detail to the present preferred embodiments of the invention, examples of which are illustrated in the accompanying drawings. Wherever possible, the same reference numbers are used in the drawings and the description to refer to the same or like parts.

In the following, details of the embodiments of the invention will be described with reference to the accompany drawings. Here, an NAND flash memory is preferred. In addition, it should be noted that the respective parts are emphasized in the accompanying drawings to facilitate understanding, and the scales of the respective parts are different from the scales of the actual components.

Embodiments

Figure 3:
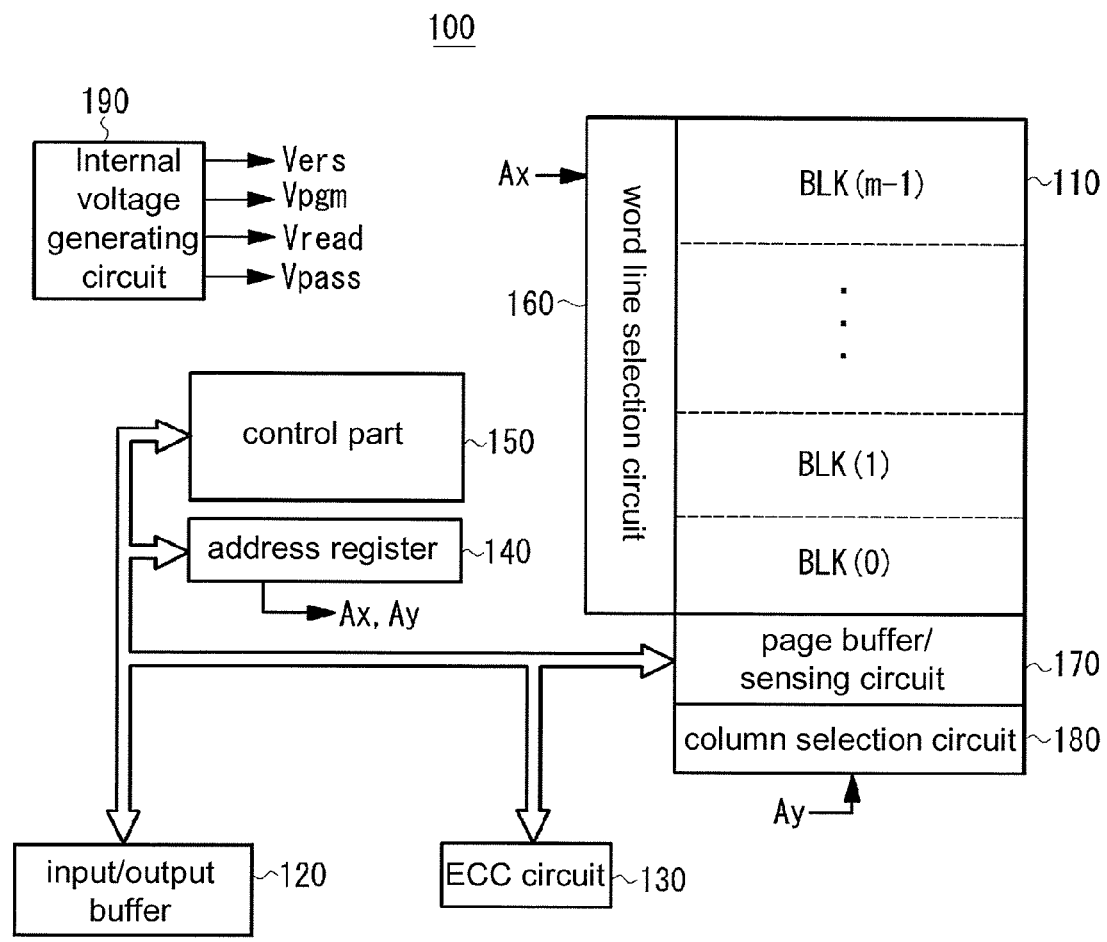
FIG. 3 is a general schematic view illustrating an NAND flash memory according to an embodiment of the invention.

A typical configuration of a flash memory according to the embodiments of the invention is shown in FIG. 3. However, it should be understood that the configuration of the flash memory shown herein is merely an example, and the invention is not necessarily limited to the configuration of the flash memory. A flash memory 100 of the embodiment includes the following components and exhibits a configuration as described below. A memory array 110 is provided, and a plurality of memory cells are arranged into an array. An input/output buffer 120 is connected to an external input/output terminal I/O to hold input/output data. An ECC circuit 130 is provided to perform an error checking and correction process on data that are programmed or read from the memory array 110. An address register 140 is provided to receive address data from the input/output buffer 120. A control part 150 is provided to receive command data from the input/output buffer 120 or receive an external control signal to control the respective parts. A word line selection circuit 160 is provided to receive row address information Ax from the address register 140, decode the row address information Ax, and select a column block and a word line based on a decoding result. A page buffer/sensing circuit 170 is provided to hold data read from the page selected by the word line selection circuit 160 or hold data to be written to the selected page. A column selection circuit 180 is provided to receive column address information Ay from the address register 140, decode the column address information Ay, and select data in the page buffer/sensing circuit 170 based on a decoding result. An internal voltage generating circuit 190 is also provided to generate various voltages (e.g., a programming voltage Vpgm, a pass voltage Vpass, a reading pass voltage Vread, and an erasing voltage Vers, etc.) required for reading, programming, and erasing of data.

Figure 4:
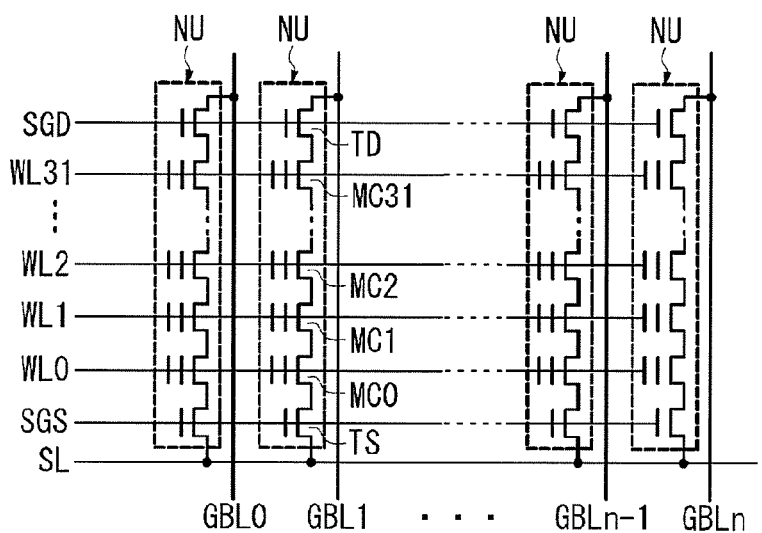
FIG. 4 is a circuit view illustrating a configuration of an NAND string in a memory cell array according to an embodiment of the invention.

The memory array 110 has a plurality of storage blocks BLK(0), BLK(1), . . . , BLK(m-1) configured along a column direction. The page buffer/sensing circuit 170 is configured near the block BLK(0). In a storage block, such as a storage block as shown in FIG. 4, for example, an NAND string unit NU serially connecting a plurality of memory cells is formed, and n+1 string units NU are arranged along a row direction in the storage block. The string unit NU includes a plurality of memory cells MCi (i=0, 1, . . . 31) connected in series, a selection transistor TD connected to a drain side of the memory cell 31 as an end part, and a selection transistor TS connected to a source side of the memory cell MC0 as another end part. A drain of the selection transistor TD is connected to a corresponding bit line of bit lines GBL0 to GBLn, and a source of the selection transistor TS is connected to a common source line SL.

A control gate of the memory cell MCi is connected to the word line WLi, and gates of the selection transistor TD and the selection transistor TS are connected to a selection gate line SGD and a selection gate line SGS arranged in parallel with the word line WLi. When the word line selection circuit 160 selects the block based on the row address information Ax or converted address information, the selection transistor TD and the selection transistor TS is optionally driven through the selection gate line SGS and the selection gate line SGD of the block. FIG. 4 is a view illustrating a configuration of a typical string unit. However, for the string unit, one or more virtual cells may be included in an NAND string.

Typically, a memory cell has a metal oxide semiconductor (MOS) structure. The MOS structure includes source/drain as an N-type diffusion region formed in a P-well, a tunnel oxidation film, formed on a channel between the source/drain, a floating gate (charge accumulation layer) formed on the tunnel oxidation film, and a control gate, formed on the floating gate through a dielectric film. When the floating gate does not accumulate charges, namely when data "1" is written, the threshold value is negative, and the memory cell is "normally on". When the floating gate accumulates charges, namely when data "0" is written, the threshold value is shifted into positive, and the memory cell is "normally off". It should be noted that the memory cell may be a single level cell (SLC) that stores one bit (binary data) or a multi-level cell (MLC) that stores multiple bits.

Table 1 illustrates an example where a bias voltage is applied in respective operations of the flash memory. In a reading operation, a positive voltage is applied to the bit line, a voltage (e.g., 0V) is applied to the selected word line, the pass voltage Vpass (e.g., 4.5V) is applied to the word lines that are not selected, a positive voltage (e.g., 4.5V) is applied to the selection gate line SGD and the selection gate line SGS to turn on the bit line side selection transistor TD and the source line side selection transistor TS, and 0V is applied to the common source line. In a programming (writing) operation, the programming voltage Vpgm at a high potential (15V to 20V) is applied to the selected word line, and an intermediate potential (e.g., 10 V) is applied to the word lines that are not selected to turn on the bit line side selection transistor TD, turn off the source line side selection transistor TS, and supply a potential corresponding to the data "0" or "1" to the bit line GBL. In an erasing operation, 0 V is applied to the selected word line in the block, and a high potential (e.g., 21V) is applied to the P-well to extract electrons of the floating gate to the substrate, so as to erase data using block as a unit.

TABLE 1

|  | Erasing | Writing | Reading |
|---|---|---|---|
| Selected word line | 0 | 15~20 V | 0 |
| Non-selected word line | F | 10 V | 4.5 |
| SGD | F | Vcc | 4.5 |
| SGS | F | 0 | 4.5 |
| SL | F | Vcc | 0 |
| P-well | 21 | 0 | 0 |

In the programming operation, data Di (data to be programmed) are loaded to the page buffer/sensing circuit 170 through the input/output buffer 120, and the ECC circuit 130 performs computation on the input data Di transmitted from the page buffer/sensing circuit 170, so as to generate an error correction symbol or a parity bit required for error checking and correction on the data being programmed. The computation of the ECC circuit may be performed based on conventional processes such as Hamming codes or Reed-Solomon codes, for example, and k bits or k bytes of the input data Di are converted in a manner of p=k+q. Here, "q" is the error correction symbol or the parity bit required for the error checking and correction on the input data Di. In a preferred embodiment, the ECC circuit 130 sets the error correction symbol in the backup area of the page buffer/ sensing circuit 170. In this way, the input data Di and the error correction symbol set in the page buffer/sensing circuit 170 are programmed in the selected page of the memory array 110.

In the reading operation, when the data read from the selected page of the memory array 110 is held by the page buffer/sensing circuit 170, the ECC circuit 130 performs error checking on the data being read based on the error correction symbol transmitted by the page buffer/sensing circuit 170. When an error is detected, the corrected data is set in the page buffer/sensing circuit 170. In addition, the data held by the page buffer/sensing circuit 170 is output through the input/output buffer 120.

Figure 5:
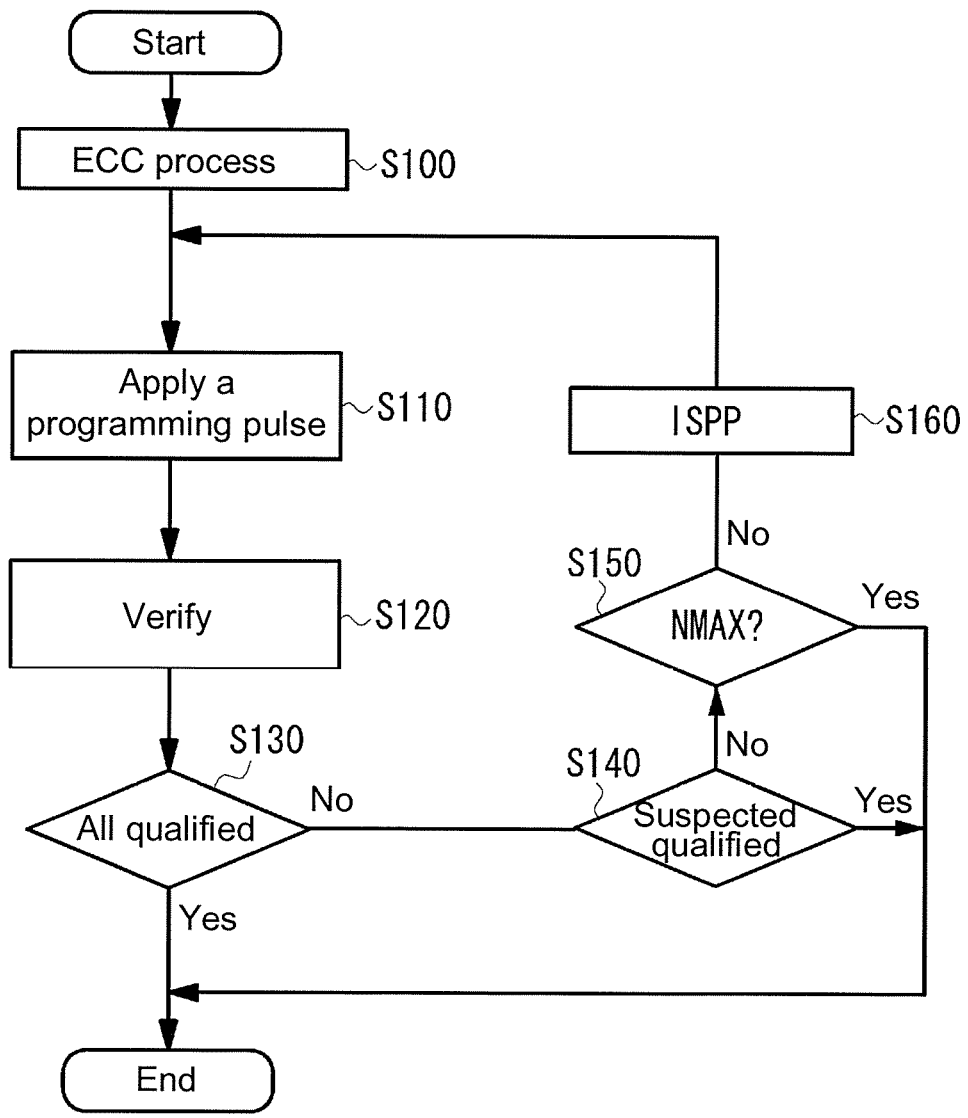
FIG. 5 is a flowchart illustrating a programming process according to an embodiment of the invention.

Then, the programming operation in the embodiment of the invention is described with reference to the flowchart shown in FIG. 5. When the control part 150 receives a programming command from the input/output buffer 120, a sequence for programming starts. The input data Di is loaded to the page buffer/sensing circuit 170. Then, the ECC circuit 130 is used to perform an ECC process on the input data Di (S100).

Figure 6:
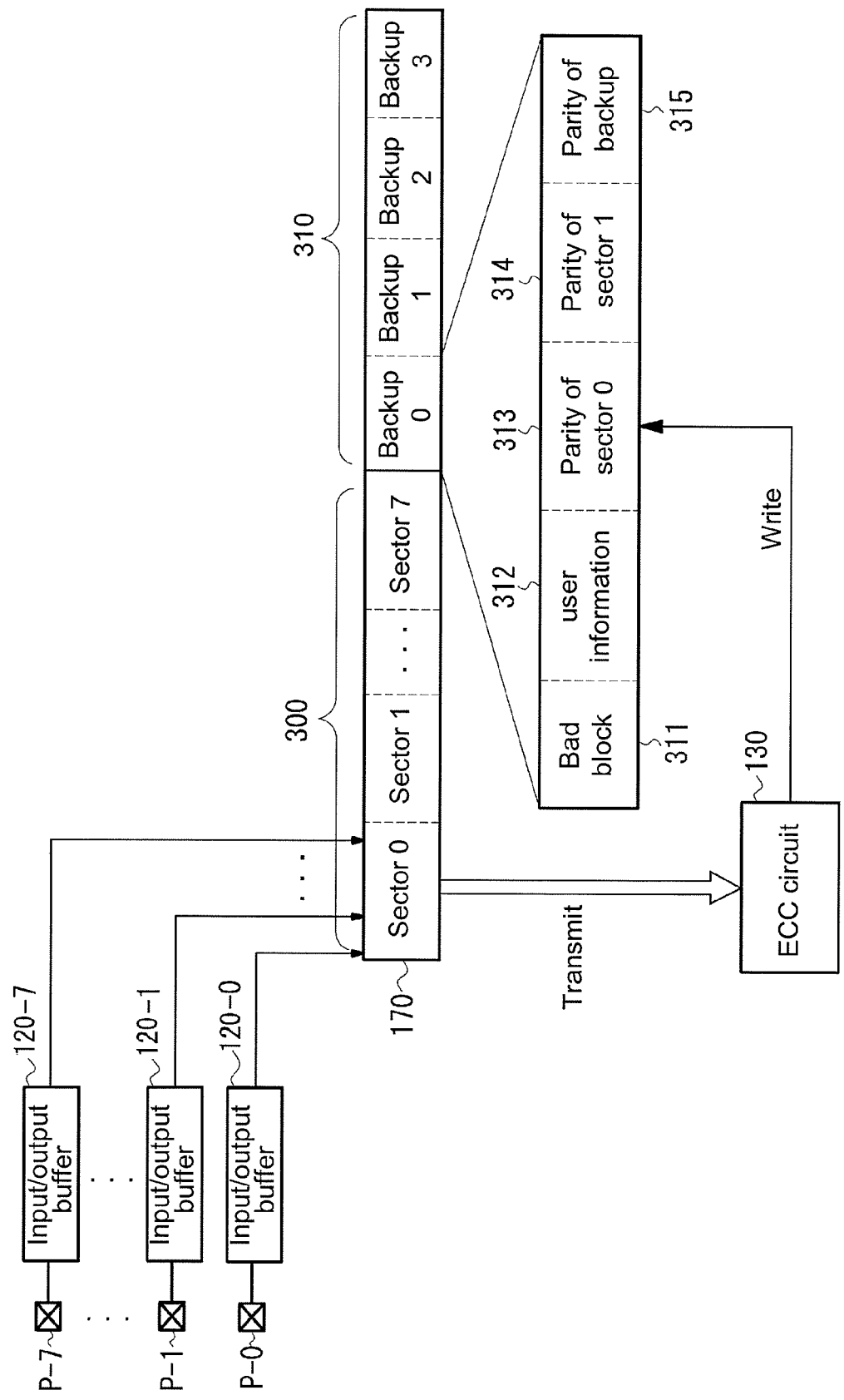
FIG. 6 is a schematic view illustrating performing an ECC process in a normal area in a programming process according to an embodiment of the invention.

FIG. 6 is a view illustrating an example of the ECC process. When the flash memory 100 has eight input/output terminals, data are loaded from external input/output terminals P-0 to P-7 to the page buffer/sensing circuit 170 through input/output buffers 120-0 to 120-7, respectively. The page buffer/sensing circuit 170 includes a normal area 300 divided into eight sectors, namely sectors 0 to sector 7, and a backup area 310 divided into four sectors, namely backup 0 to backup 3, for example.

A sector in the normal area 300 is formed of 256 bytes, for example. Under such circumstance, the eight sectors of the normal area 300 are able to approximately hold programming data of a total of 2 Kbytes. A sector in the backup area 310 is formed of 16 bytes, for example. Under such circumstance, the four sectors (backup 0 to backup 3) are able to keep data of 64 bytes in total. Each sector of the backup area 310 includes, for example, an area 311 storing information for identifying a bad block with a bad memory cell, an area 312 storing information relating to user data, areas 313 and 314 storing error correction symbols (parity bits) of two sectors of the normal area 300, and an area 315 storing an error correction symbol (parity bit) for performing the ECC computation on the backup area 310. The areas 313 and 314 in the backup 0 of the backup area 310 respectively store error correction symbols (parity bit) of the sector 0 and the sector 1 of the normal area 300, and the areas 313 and 314 of the backup 1 of the backup area 310 store error correction symbols (parity bits) of the sector 2 and the sector 3 of the normal area 300. In the same light, the backup 2 of the backup area 310 stores parity bits of the sectors 4 and the sector 5 of the normal area 300, and the backup 3 of the backup area 310 stores parity bits of the sector 6 and the sector 7 of the normal area 300.

In the normal area 300, a sector is assigned with the input/output buffers 120-0 to 120-7. Namely, 256 bits are assigned in an external input/output terminal (i.e., 256×8=1 sector). The column selection circuit 180 decodes the column address information Ay received in the programming operation, and, based on a decoding result, chooses to load a sector with data input in the external input/output terminals P-0 to P-7. FIG. 6 is a view illustrating an example that data received by the external input/output terminals P-0 to P-7 are loaded to the sector 0 based on the column address information Ay.

In the example shown herein, the ECC circuit 130 includes a writing circuit for writing the error correction symbol. Preferably, the ECC circuit 130 may perform the ECC computation on data with a number of bytes equal to a sector of the normal area 300. If a sector of the normal area 300 has 256 bytes, the ECC circuit may perform the ECC computation on 256 bytes of data and, for example, generating an error correction symbol correcting an error of one bit. Under such circumstance, the eight sectors allow an error correction of 8 bits at maximum.

The ECC circuit 130 may write the error correction symbol generated to the area 313 or 314 in the corresponding sector of the backup area 310. In the example of FIG. 6, the data being programmed are loaded to the sector 0 of the normal area 300. Therefore, the error correction symbol is written to the area 313 storing the parity of the backup 0.

Figure 7:
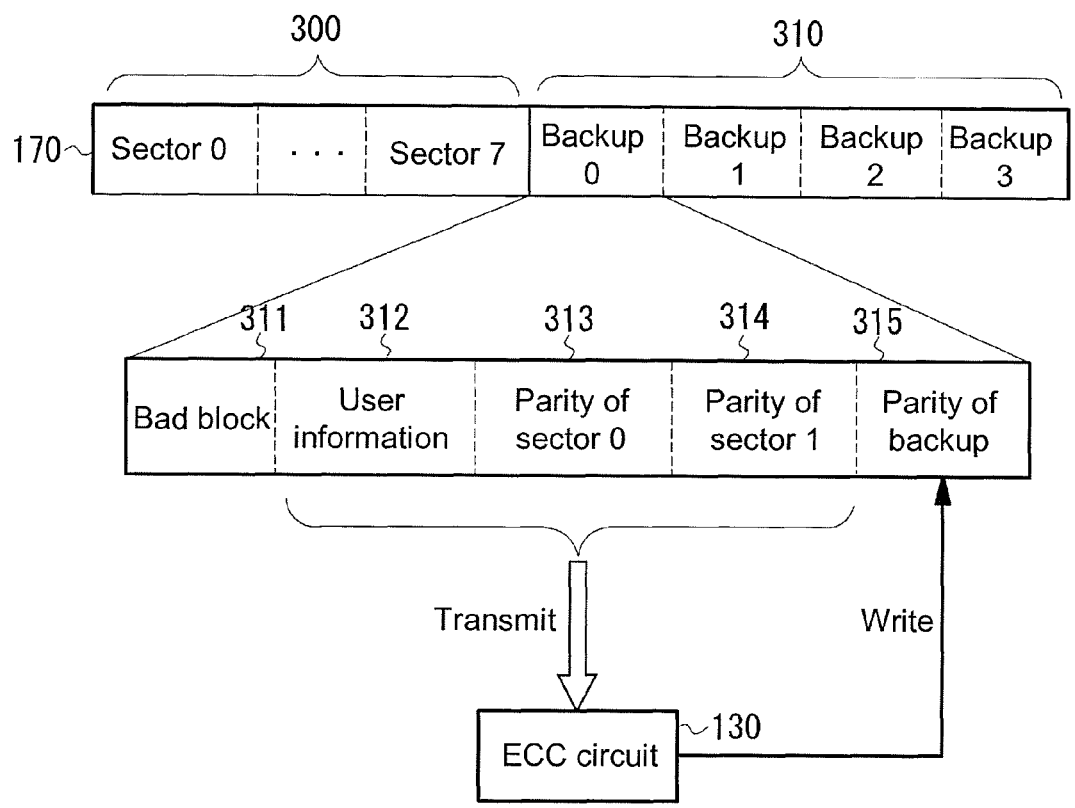
FIG. 7 is a schematic view illustrating performing an ECC process in a backup area in a programming process according to an embodiment of the invention.

FIG. 7 illustrates the ECC process on the data in the backup area 310. When the ECC process on the respective sectors of the normal area 300 is finished, the ECC process is performed on the respective sectors of the backup area 310. It is arbitrary to determine the sector in the backup area 310 the data of which undergo the ECC process. However, in this embodiment, it is set that the data in the areas 312 to 314 undergo the ECC process. Thus, the data in the areas 312 to 314 in the backup 0 are transmitted to the ECC circuit 130, and the error correction symbol generated through the ECC process is written to the area 315 of the backup 0 by using the ECC circuit 130. The same process is performed to the backups 1 to 3.

Referring to FIG. 5 again, when the ECC process is finished (S100), programming of the memory array 110 starts. The word line of the memory array 110 is selected by using the word line selection circuit 160, a voltage corresponding to the data held by the page buffer/sensing circuit 170 is supplied to the bit line, and a programming pulse is applied to the selected page (S110). Then, a programming verification process is performed (S120) to check whether the threshold value of the memory cell with the data "0" is equal to or more than a fixed value. If a verification result indicates that all the bits of the selected page are qualified, the programming is completed.

When not all the bits are qualified, the control part 150 determines that the selected page is suspectedly qualified (S140). A maximum number Np of unqualified bits to be determined as suspectedly qualified is equal to or less than a maximum number Ncc of bits that the ECC circuit 130 is able to repair. If the number of unqualified bits in the verification, namely the number Nf of the unqualified bits actually generated in the selected page, is equal to or less than the maximum number Np of unqualified bits to be determined as suspected qualified (Nf≤Np), the determination of suspectedly qualified is made (S140). When the determination of suspectedly qualified is made, the programming is completed, and the unqualified bits with bad "0" are directly stored in the selected page.

Alternatively, when the determination made is not suspectedly qualified (S140), the control part 150 determines whether the number of times of applying the programming pulse reaches NMAX (S150). If not, the programming pulse is applied to the selected page based on incremental step program pulse (ISPP) (S160). When the number of times of applying the programming pulse reaches NMAX, an external controller is informed of a state of programming failure, and the block is treated as a bad block for further management. Under such circumstance, identification information as bad block is stored in the area 311 of the backup area. Moreover, when data including the unqualified bits considered to be suspectedly qualified are read, the ECC circuit 130 may detect the unqualified bits as errors and correct the unqualified bits into correct data.

Figure 8:
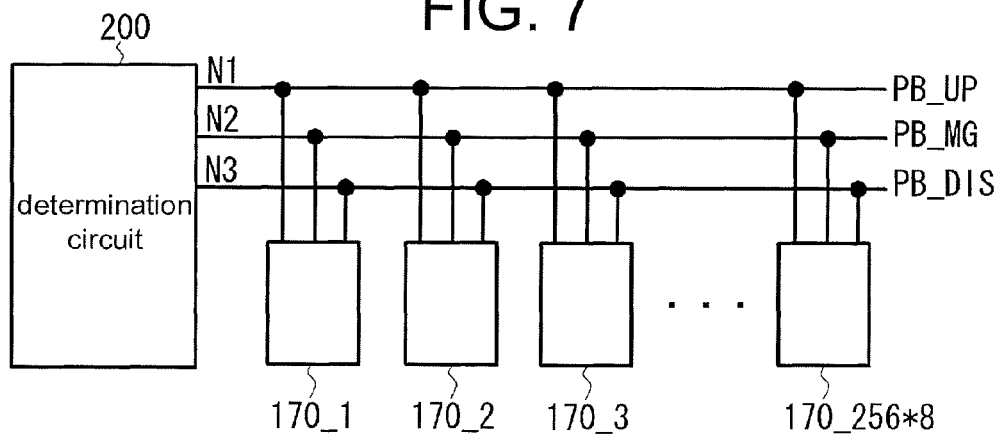
FIG. 8 is a view illustrating a connecting relation between a determination circuit that determines suspectedly qualified and a page buffer/sensing circuit according to an embodiment of the invention.

Then, a determination circuit for making the determination of suspectedly qualified that operates in the programming operation of the embodiment is described in the following. FIG. 8 is a view illustrating a connecting relation between the determination circuit for making the determination of suspectedly qualified and a page buffer/sensing circuit. In a preferred embodiment, when the ECC process is performed using sector as a unit, a determination circuit 200 is provided in each of the sectors. For example, as shown in FIG. 6, when a page is divided into eight sectors, and each sectors is formed of 256 bytes, one determination circuit is connected to one sector, namely 256×8 page buffer/sensing circuits 170_1, 170_2, 170_3 to 170_256×8. Thus, eight determination circuits are provided in one page.

As shown in FIG. 8, the determination circuit 200 is connected to wirings PB_UP, PB_MG, and PB_DIS through nodes N1, N2, and N3. The wirings PB_UP, PB_MG, and PB_DIS are common connected in a parallel connection with the 256×8 page buffer/sensing circuits 170_1 to 170_256×8. When the ECC circuit 130 performs the ECC computation on 256 bytes of data, if the ECC circuit 130 is able to repair four bits of errors at maximum, for example, the determination circuit 200 permits to determine four bits of unqualified bits (bad programming of data "0") to be suspected unqualified.

In other preferred embodiments, when the ECC process is not performed using sector as a unit but using page as a unit, the determination circuit may be provided in each page. Under such circumstance, the determination circuit may set the unqualified bits permissible in determining whether it is suspectedly qualified based on the maximum number of error bits that the ECC circuit is able to repair.

Figure 9:
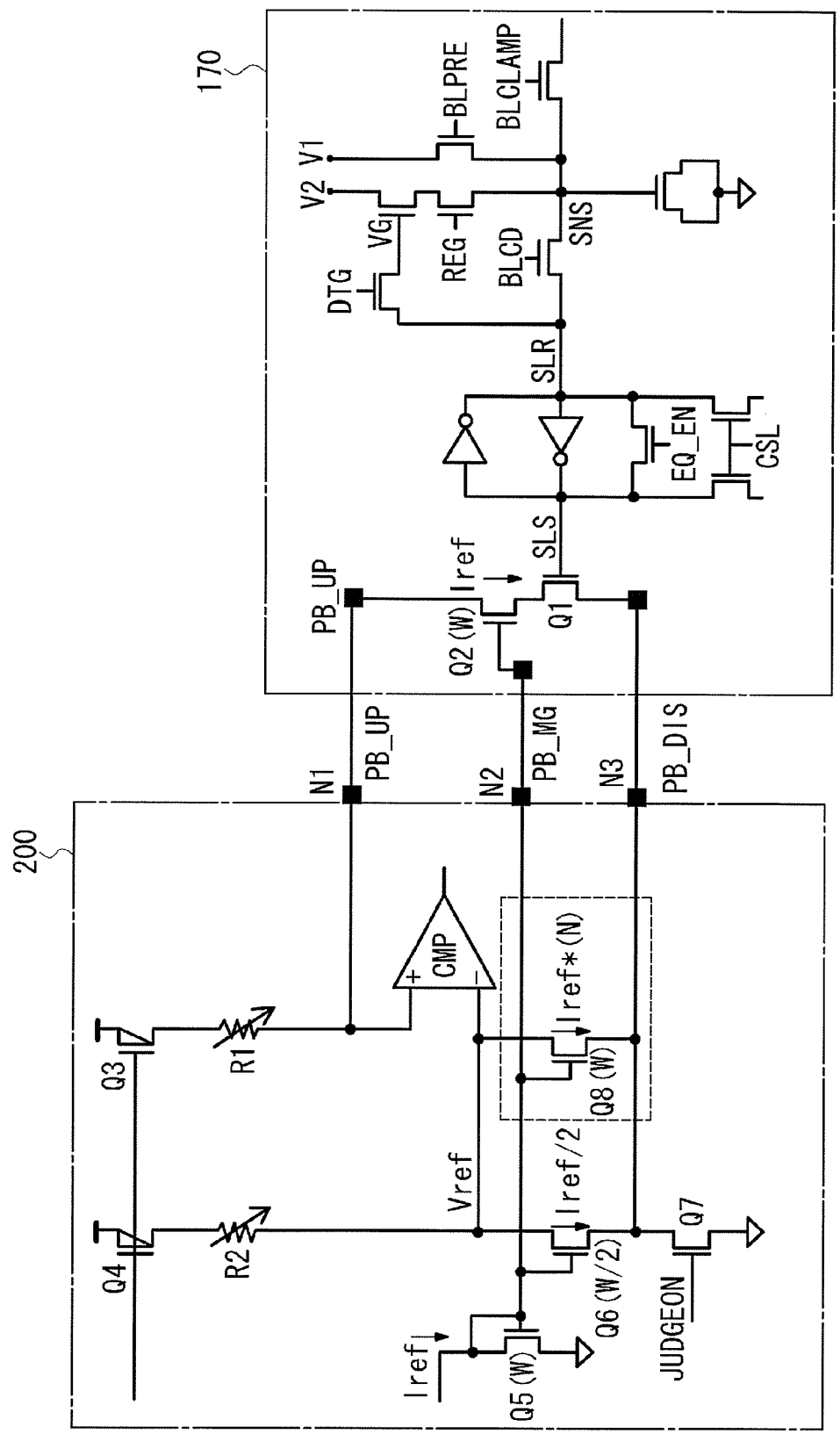
FIG. 9 is a view illustrating a configuration of a determination circuit and a page buffer/sensing circuit according to a first embodiment of the invention.

Then, details of the determination circuit are described in the following. FIG. 9 is a view illustrating a configuration of the determination circuit and the page buffer/sensing circuit that the determination circuit is connected to. Typically, the page buffer/sensing circuit 170 includes a transistor BLPRE precharging a voltage from a voltage supply part V1 to the bit line, a transistor BLCLAMP clamping the bit line, a transistor BLCD enabling charge transmission between a sensing node SNS and a latch node SLR, a transistor DTG transmitting a potential of the latch node SLR to a transistor VG connected to a voltage supply part V2, and a transistor REG combining the voltage supply part V2 at the sensing node SNS. For example, when the sensing node SNS needs to be turned from the L potential to the H potential in the programming verification, the transistor DTG may operate. Alternatively, when the sensing node SNS is turned from the H potential to the L potential, the transistor DTG also operates. The page buffer/sensing circuit 170 may further include a latch circuit obtained by cross-coupling a pair of inverters. The latch circuit includes a transistor EQ_EN making the nodes SLR and SLS equivalent, a transistor CSL combining the nodes SLR and SLS to the data line, and a transistor Q1 combined at the node SLS, and a transistor Q2 serially connected to the transistor Q1.

The page buffer/sensing circuit 170 further includes a circuit that outputs a result on whether the programming verification is qualified or not. The circuit includes the NMOS transistor Q1 and the NMOS transistor Q2 serially connected between the wirings PB_UP and PB_DIS. The latch node SLS is supplied to a gate of the transistor Q1, and the wiring PB_MG is connected to a gate of the transistor Q2. The wiring PB_UP is connected to the node N1 of the determination circuit 200, the wiring PB_MG is connected to the node N2, and the wiring PB_DIS is connected to the node N3. As explicated below, the transistor Q2 is a transistor having a size W the same as those of the transistors Q5 and Q8. When the transistor Q1 is turned on, a reference current Iref flows through the transistor Q2. When the programming verification is qualified, the latch node SLS becomes the L potential, and the transistor Q1 is disconnected. No current flows from the wiring PB_UP to the wiring PB_DIS, so a voltage of the wiring PB_UP does not change. When the programming verification is not qualified, the latch node SLS becomes the high potential H, and the transistor Q1 is turned on. Under such circumstance, the reference current Iref flows through the transistor Q2 so the voltage of the wiring PB_UP drops because of the reference current Iref.

The determination circuit 200 includes PMOS transistor Q3 and Q4 connected to a voltage supply source, a variable resistor R1, a variable resistor R2, a comparator CMP, the NMOS transistor Q5, an NMOS transistor Q6, an NMOS transistor Q7, and the NMOS transistor Q8. The PMOS transistor Q3 and the PMOS transistor Q4 function as current sources and respectively adjust the variable resistor R1 and the variable resistor R2 by making voltages output from the variable resistor R1 and the variable resistor R2 equal. Namely, as an initial setting, the resistor R1 and the resistor R2 are adjusted by making the voltage of the wiring PB_UP and the reference voltage Vref equal. The output of the variable resistor R1, namely the voltage of the wiring PB_UP, may be connected to an input terminal (+) of the comparator CMP, and the output of the variable resistor R2, namely the reference voltage Vref, is connected to another input terminal (−) of the comparator CMP. The comparator CMP compares the two input voltages and output the voltage of the H potential or the L potential. The H potential indicates suspectedly qualified, whereas the L potential indicates unqualified.

The transistor Q5 is connected to a constant current source and the reference current Iref flows through the transistor Q5. A gate of the transistor Q5 is connected to the node N2, namely the wiring PB_MG. The transistor Q6 is serially connected to the variable resistor R2, and a gate of the transistor Q6 is connected to the node N2. The transistor Q7 is serially connected between the transistor Q6 and GND and supplies a gate of the transistor Q7 a JUDGEON signal. When the programming verification is performed, the JUDGEON signal is driven to the H potential, and the transistor Q7 is turned on. Connecting nodes of the transistor Q6 and the transistor Q7 are connected at the node N3, namely the wiring PB_DIS. Here, the size (W/2) of the transistor Q6 is half of the size (W) of the transistor Q5 and the transistor Q2. Thus, when the transistor Q7 is turned on, half of Iref flows through the transistor Q6.

The transistor Q8 is set in correspondence with the number N of unqualified bits determined to be suspectedly qualified or not by the determination circuit 200. When the number of unqualified bits determined to be suspectedly qualified or not by the determination circuit 200 is 0 bits, the transistor Q8 actually may not be required. Alternatively, even if the transistor Q8 is disposed, the transistor Q8 is still disabled (N=0). When one bit of unqualified bits is determined to be suspected qualified or not, one transistor Q8 (N=1) is required. If two bits of unqualified bits are determined to be suspectedly qualified or not, two transistors Q8 (N=2) connected in parallel are required. The maximum number of unqualified bits to be determined as suspected qualified or not by the determination circuit 200 is the maximum number of bits that the ECC circuit 130 is able to repair.

FIG. 9 illustrates one transistor Q8. As already noted, the transistor Q8 is set in correspondence with the number N of the unqualified bits determined to be suspectedly qualified or not. The transistor Q8 is connected between the reference voltage Vref and the wiring PB_DIS, and a gate of the transistor Q8 is connected to the wiring PB_MG. Here, the size (W) of the transistor Q8 is the same as the sizes (W) of the transistor Q5 and the transistor Q2. When the transistor Q7 is turned on, the reference current Ira flows in the transistor Q8.

Figure 10:
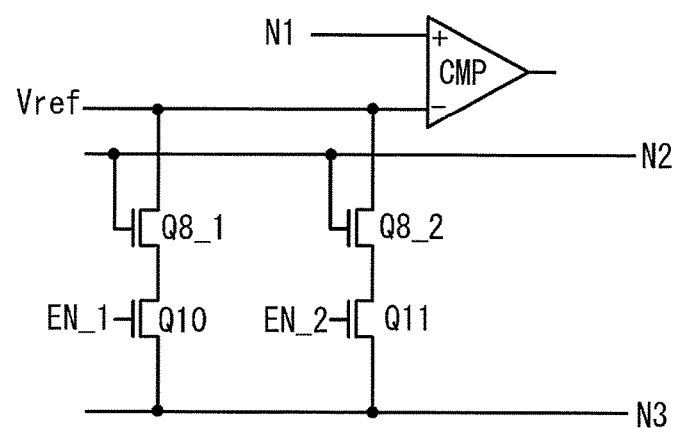
FIG. 10 is a view illustrating a process of selecting the number of operable transistors according to the first embodiment of the invention.

The transistor Q8 is provided based on the number (N) of the unqualified bits determined to be suspectedly qualified or not. In addition, the transistors Q8 may be connected based on the number N, such that the transistors Q8 are all operable. Alternatively, the number of the operable transistors Q8 may be arbitrarily selected from the plurality of transistors Q8 that are connected. FIG. 10 is a view illustrating an example of selecting the number of the operable transistors Q8 from the connected transistors Q8. A transistor Q8_1 and a transistor Q10 are connected in series between the reference voltage Vref and the wiring PB_DIS, and the a transistor Q8_2 and a transistor Q11 that are connected with the transistor Q8_1 and the transistor Q10 in parallel are connected in series. An enable signal EN_1 and an enable signal EN_2 are provided to gates of the transistor Q10 and the transistor Q11. When the enable signal EN_1 and the enable signal EN_2 are driven to the H potential, the transistor Q8_1 and the transistor Q8_2 operate in a manner that the reference current Iref flows through. By driving one of the enable signal EN_1 and the enable signal EN_2 to the L potential, one of the transistors Q8 operates in a manner that the reference current Iref flows through. By driving both the enable signal EN_1 and the enable signal EN_2 to the L potential, none of the transistor Q8_1 and the transistor Q8_2 operates. The enable signal EN_1 and the enable signal EN_2 are driven in response to the control signal of the control part 150, for example. Here, while it is possible to make a selection on the transistor Q8_1 and the transistor Q8_2 by switching the transistor Q10 and the transistor Q11, such arrangement also enables to more persistently fix the selected transistor Q8 as compared to an arrangement where the transistors Q10 and Q11 is replaced with a fuse.

Then, the operation of the determination circuit 200 is described in the following. Table 2 provides current values of the respective parts when the determination circuit determines 0 bits, 1 bit, or 2 bits of unqualified bits to be suspectedly qualified and a table of difference of the current values.

TABLE 2

| Suspected qualified | Qualified or not | Iref(Vref) | Iref(PB_UP) | ΔIref |
|---|---|---|---|---|
| 0 bits | Qualified | Iref/2 | 0(0 bits unqualified •) | +Iref/2 |
|  | Unqualified |  | Iref(1 bit unqualified) | −Iref/2 |
| 1 bit | Qualified | Iref/2 + Iref | Iref(1 bit unqualified •) | +Iref/2 |
|  | Unqualified |  | 2Iref(2 bits unqualified) | −Iref/2 |
| 2 bits | Qualified | Iref/2 + 2Iref | 2Iref(2 bits unqualified •) | +Iref/2 |
|  | Unqualified |  | 3Iref(3 bits unqualified) | −Iref/2 |

(1) In the Case of Determining 0 Bits of Unqualified Bits:
First of all, the case of determining 0 bits of unqualified bits is described in the following. In this case, whether the programming of all the bits succeeds is determined. In this condition, the transistor Q8 is not required or the transistor Q8 is disabled (N=0). In addition to applying a verification voltage to the selected word line, the programming verification is similar to the reading operation in that, when the programming of all the bits succeeds, the selected memory cell is not turned on, and the potentials of all the bit lines are not discharged but at a precharged potential. Thus, the latch node SLS is at the L potential, the transistor Q1 is disconnected, and the voltage of the wiring PB_UP does not change. In addition, during verification, the JUDGEON signal is driven to the H potential, the transistor Q7 is turned on, and the wiring PB_DIS is at the GND potential. Here, a current of ½ Iref flows in the transistor Q6, so the reference voltage Vref is adjusted to a value corresponding to a voltage drop of ½ Iref. Then, the voltage of the wiring PB_UP is higher than the reference voltage Vref by ½ Iref, so the comparator COMP output a signal at the H potential indicating qualified.

Alternatively, when one bit of unqualified bit is present, the latch node SLS of one page buffer/sensing circuit 170 becomes the H potential, the transistor Q1 is turned on, and the current of Iref flows in the transistor Q2. Thus, the voltage of the wiring PB_UP adjusted to a value dropping by the amount of Iref. Thus, the voltage of the wiring PB_UP is lower than the reference voltage Vref by ½ Iref, and the comparator COMP consequently outputs a signal at the L potential indicating unqualified.

(2) The Case of Determining 1 Bit of Unqualified Bits:
In the case of determining one bit of unqualified bits (N=1), one transistor Q8 is configured to be operable. For example, in the case of FIG. 10, the enable signal EN_1 is driven to the H potential, and the enable signal EN_2 is driven to the L potential. Accordingly, when programming of all the bits succeeds, the transistor Q1 is disconnected, and the voltage of the wiring PB_UP does not change, and when one bit of unqualified bits is present, the transistor Q1 of one page buffer/sensing circuit is turned on, and the voltage of the wiring PB_UP drops by the amount of Iref. When the JUDGEON signal is driven to the H potential, the transistor Q7 is turned on, and the wiring PB_DIS becomes the GND potential, the current of ½ Iref flows in the transistor Q6, and then the current of Iref flows in the transistor Q8. Thus, the reference voltage Vref is adjusted to a value dropping by the amount of ½ Iref+Iref. Consequently, the voltage of the wiring PB_UP is higher than the reference voltage Vref, and the comparator CMP outputs the H potential.

Alternatively, when two bits of unqualified bits are present, the transistors Q1 of two page buffer/sensing circuits are turned on, and the voltage of the wiring PB_UP drops by 2×Iref. Consequently, the voltage of the wiring PB_UP is lower than the reference voltage Vref, and the comparator CMP outputs the L potential.

(3) The Case of Determining 2 Bit of Unqualified Bits:
In the case of determining two bits of unqualified bits (N=2), two transistors Q8 are configured to be operable. For example, in the case of FIG. 10, the enable signal EN_1 is driven to the H potential, and the enable signal EN_2 is driven to the L potential. In addition, when two bits of unqualified bits are present, the transistors Q1 of two page buffer/sensing circuits are turned on, and the voltage of the wiring PB_UP drops by the amount of 2×Iref. When the JUDGEON signal is driven to the H potential, the transistor Q7 is turned on, and the wiring PB_DIS becomes the GND potential, the current of ½ Iref flows in the transistor Q6. Consequently, the current of 2×Iref flows in the two transistors Q8. Thus, the reference voltage Vref becomes a value dropping by the amount of ½ Iref+2×Iref. Consequently, the voltage of the wiring PB_UP is higher than the reference voltage Vref, and the comparator CMP outputs the H potential.

Alternatively, when three bits of unqualified bits are present, the transistors Q1 of three page buffer/sensing circuits are turned on, and the voltage of the wiring PB_UP drops by the amount of 3×Iref. Consequently, the voltage of the wiring PB_UP is lower than the reference voltage Vref, and the comparator CMP outputs the L potential.

Based on above, in the embodiment, the determination circuit may determine whether the unqualified bits are suspectedly qualified by comparing the voltage generated by the reference current corresponding to the number of unqualified bits and the reference voltage generated by the reference current corresponding to the number of unqualified bits added by ½ of the reference current.

Figure 11:
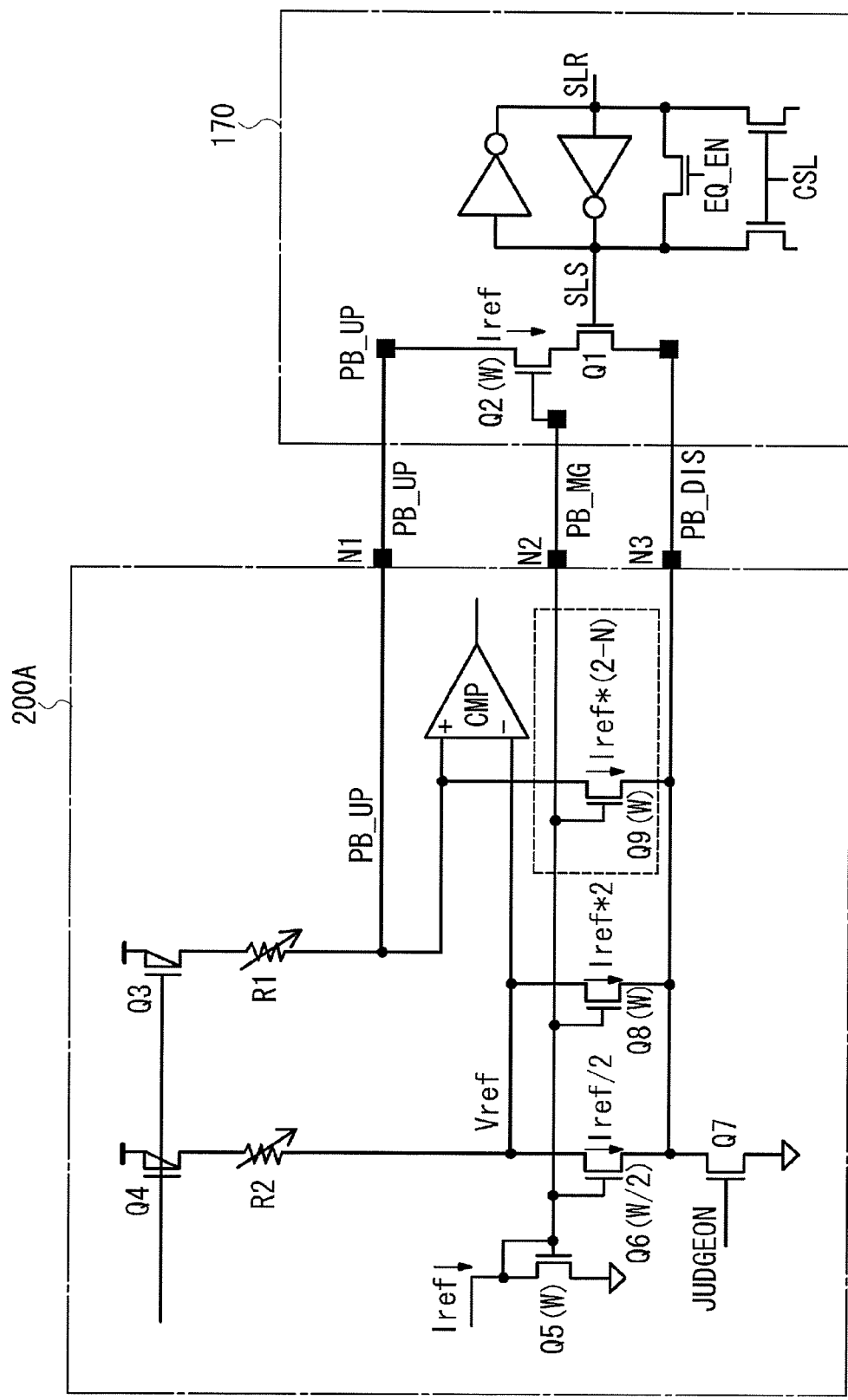
FIG. 11 is a view illustrating a configuration of a determination circuit and a page buffer/sensing circuit according to a second embodiment of the invention.

Then, a second embodiment of the invention is described in the following. A determination circuit 200A of the second embodiment is shown in FIG. 11. In the second embodiment, in the determination of 0 bits, 1 bit, and two bits of unqualified bits, the reference voltage Vref is fixed. In the example of the drawing, two transistors Q8 are connected, and the reference voltage Vref is fixed at a value when ½ Iref flows through the transistor Q6 and 2×Iref flows through the transistor Q8.

Then, 2–N transistors Q9 are connected to the wiring PB_UP. The transistor Q9 has the same size W of the transistor Q8 and the current of Iref flows through the transistor Q9. When the determination circuit 200A enables 0 bits of unqualified bits (N=0), the number of the transistors Q9 is two. The two transistors Q9 are connected in parallel between the wiring PB_UP and the wiring PB_DIS. When the transistor Q7 is turned on, the current of 2×Iref flows from the wiring PB_UP to the wiring PB_DIS through the transistors Q9. In the case of determining 1 bit of unqualified bits (N=1), the number of the transistor Q9 is 1, and the current of 1×Iref flows, and in the case of determining 2 bits of unqualified bits (N=2), the number of the transistor Q9 is 0. As shown in FIG. 10, the number of the transistors Q9 may also be selected by two enabling transistors serially connected with two transistors Q9.

Table 3 provides current values of the respective parts when the determination circuit of the second embodiment determines 0 bits, 1 bit, or 2 bits of unqualified bits to be suspectedly qualified or not.

TABLE 3

| Suspectedly qualified | Qualified or not | Iref(Vref) | Iref(PB_UP) | ΔIref |
|---|---|---|---|---|
| 0 bits | Qualified | Iref/2 + 2Iref | 0Iref + 2Iref(0 bits unqualified) | +Iref/2 |
|  | Unqualified |  | 1Iref + 2Iref(1 bit unqualified) | −Iref/2 |
| 1 bit | Qualified |  | 1Iref + 1Iref(1 bit unqualified •) | +Iref/2 |
|  | Unqualified |  | 2Iref + 1Iref(2 bits unqualified) | −Iref/2 |
| 2 bits | Qualified |  | 2Iref + 0Iref(2 bits unqualified) | +Iref/2 |
|  | Unqualified |  | 3Iref + 0Iref(3 bits unqualified) | −Iref/2 |

(1) The Case of Determining 0 Bit of Unqualified Bits:
Whether the programming of all the bits succeeds is determined, and the reference voltage Vref is fixed at a value dropping by ½ Iref+2×Iref. In addition, by using the two transistors Q9, the current of 2×Iref flows through the transistor Q7 into GND. Thus, the voltage of the wiring PB_UP is adjusted to a value dropping by 2×Iref. Accordingly, the comparator CMP outputs the H potential (qualified). In the case that one bit of unqualified bits is present, the voltage of the wiring PB_UP may drop by 2×Iref+Iref=3×Iref and become lower than the reference voltage Vref. Therefore, the comparator CMP outputs the L potential (unqualified).

(2) The Case of Determining 1 Bit of Unqualified Bits:
Similar to the above, the reference voltage Vref is fixed at the value dropping by ½ Iref+2×Iref. In addition, the number of the transistor Q9 is one. Thus, when one bit of unqualified bits is present, due to Iref of the transistor Q2 and Iref of the transistor Q9, the voltage of the wiring PB_UP drops by 2×Iref and becomes higher than the reference voltage Vref. Therefore, the comparator CMP outputs the H potential indicating qualified. When unqualified bits are 2 bits, the voltage of the wiring PB_UP drops by 3×Iref and becomes lower than the reference voltage Vref. Therefore, the comparator CMP outputs the L potential indicating unqualified.

(3) The Case of Determining 2 Bits of Unqualified Bits:
Similar to the above, the reference voltage Vref is fixed at the value dropping by ½ Iref+2×Iref. In addition, the transistor Q9 is 2–N=0. When there are 2 bits of unqualified bits, due to the transistor Q2, the voltage of the wiring PB_UP drops by 2×Iref and becomes higher than the reference voltage Vref. Therefore, the comparator CMP outputs the H potential indicating qualified. When there are 3 bits of unqualified bits, the voltage of the wiring PB_UP drops by 3×Iref than the transistor Q2 and becomes lower than the reference voltage Vref. Therefore, the comparator CMP outputs the L potential indicating unqualified.

Figure 12:
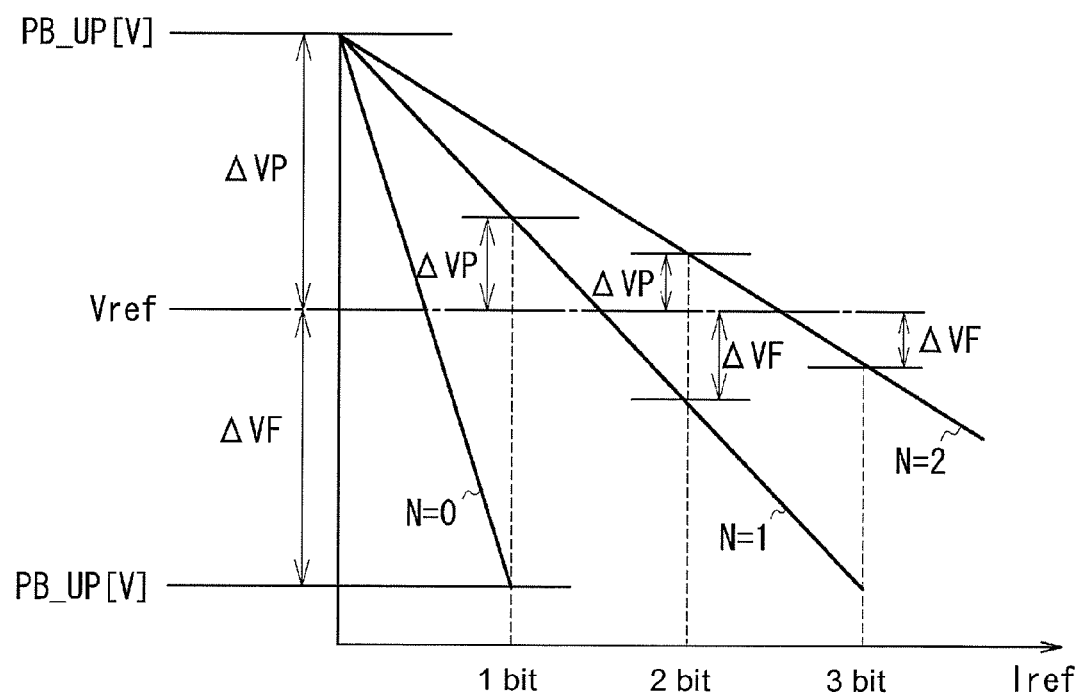
FIG. 12 is a view illustrating a relation between a reference voltage Vref and a voltage of a wiring PB_UP in the determination circuit according to the second embodiment of the invention.

Based on the second embodiment, since the reference voltage Vref is fixed, the adjustment becomes easier as the adjustment to the variable transistor R1 can be made when changing the number of the transistor Q9. In addition, FIG. 12 is a view illustrating a relation between the reference voltage Vref and the voltage of the wiring PB_UP in the determination of suspected qualification in the cases of 0 bits, 1 bit, and 2 bits. Since the current of 3/2 Iref flows in the transistors Q6 and Q8, the voltage drop of the reference voltage Vref becomes more significant than that in the first embodiment. Thus, the voltage difference (i.e., the margin for determination) between the reference voltage Vref and the wiring PB_UP becomes greater, and an erroneous determination (ΔVP is a voltage difference for the determination of qualified, and ΔVF is a voltage difference for the determination of unqualified) is consequently suppressed.

Figure 13:
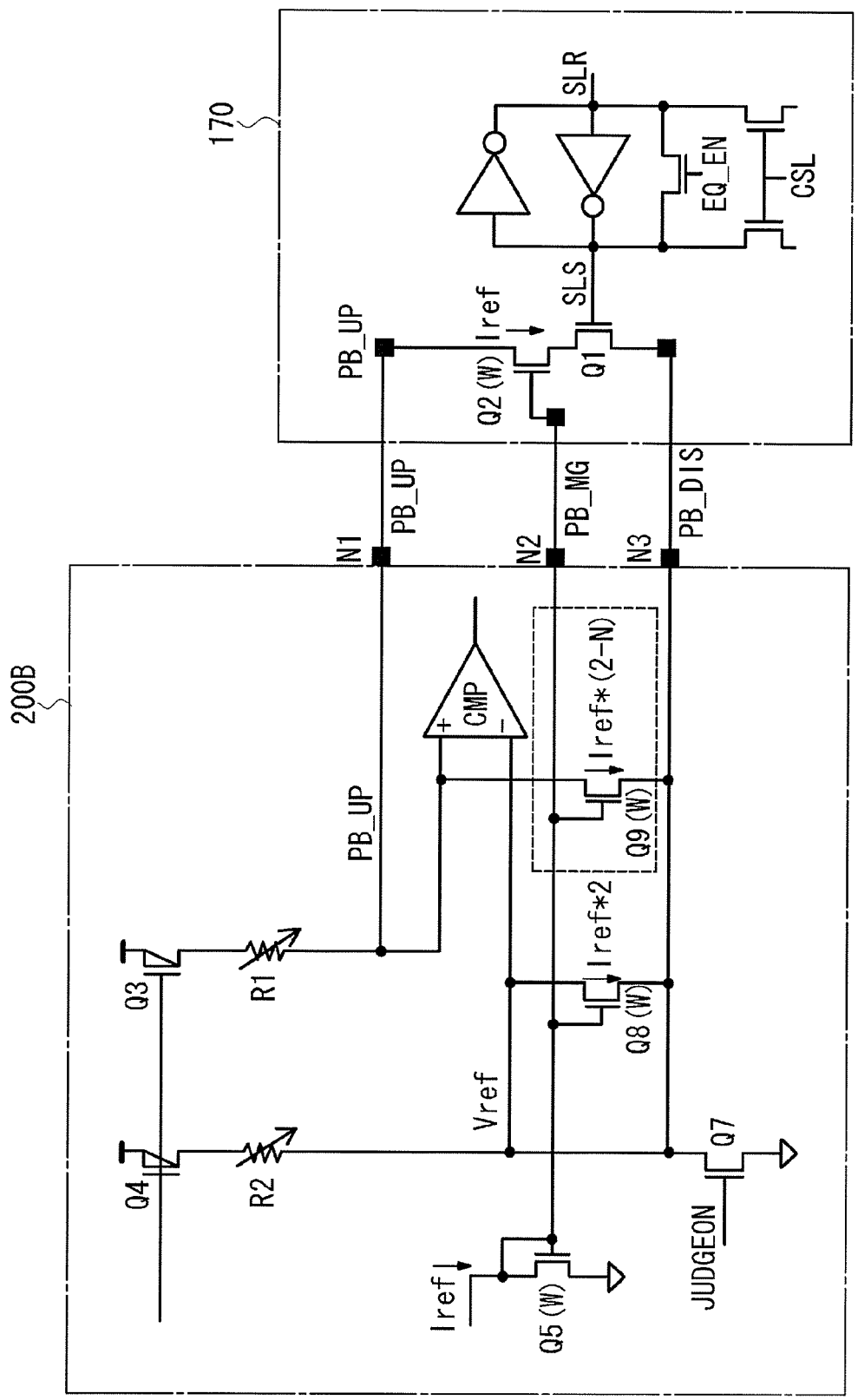
FIG. 13 is a view illustrating a configuration of a determination circuit and a page buffer/sensing circuit according to a modified example of the second embodiment of the invention.

Then, a modified example of the second embodiment is shown in FIG. 13. In the modified example, the variable resistor R2 generates ½ Iref in replacement of the transistor Q6. Since the transistor Q6 has a more subtle structure and is in a size ½ of the sizes of the transistor Q2, the transistor Q5, the transistor Q8, and the transistor Q9, it is more difficult to manufacture the transistor Q6. Therefore, the transistor Q6 is removed, and the variable resistor R2 is adjusted to generated ½ Iref. Except this difference, the configuration of the modified example is the same as that of the second embodiment.

Then, a third embodiment of the invention is described in the following. As shown in FIG. 12 illustrating the second embodiment, in the determination of suspectedly qualified for 1 bit and 2 bits of unqualified bits, the reference current of the transistor Q9 is reduced, and the inclination become less significant. Thus, the margin for determination, namely the voltage difference ΔVP and the voltage difference ΔVF become smaller, making it more likely to come to an erroneous determination. The third embodiment is described in the following to touch upon this issue.

Figure 14:
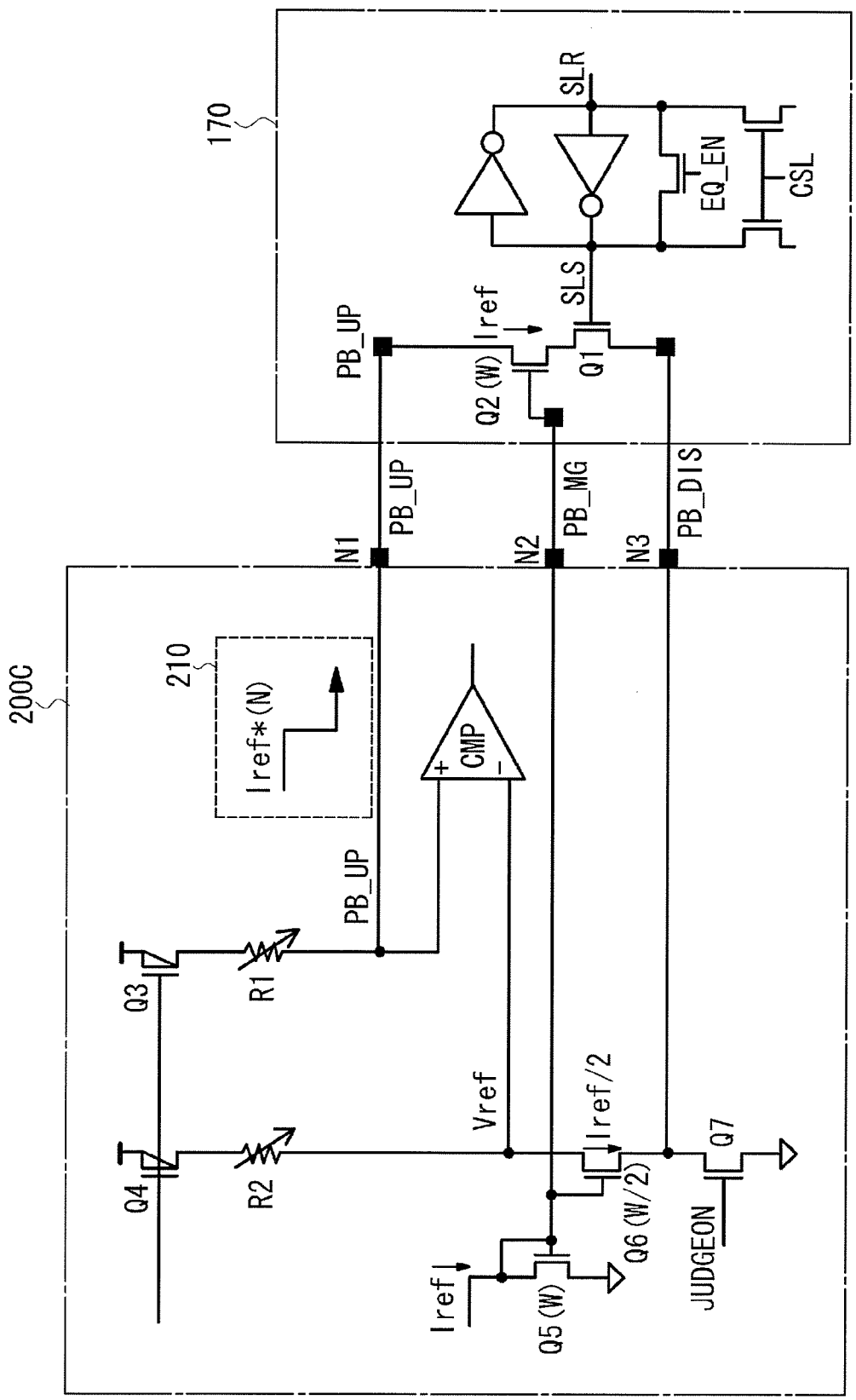
FIG. 14 is a view illustrating a configuration of a determination circuit and a page buffer/sensing circuit according to a third embodiment of the invention.
Figure 15:
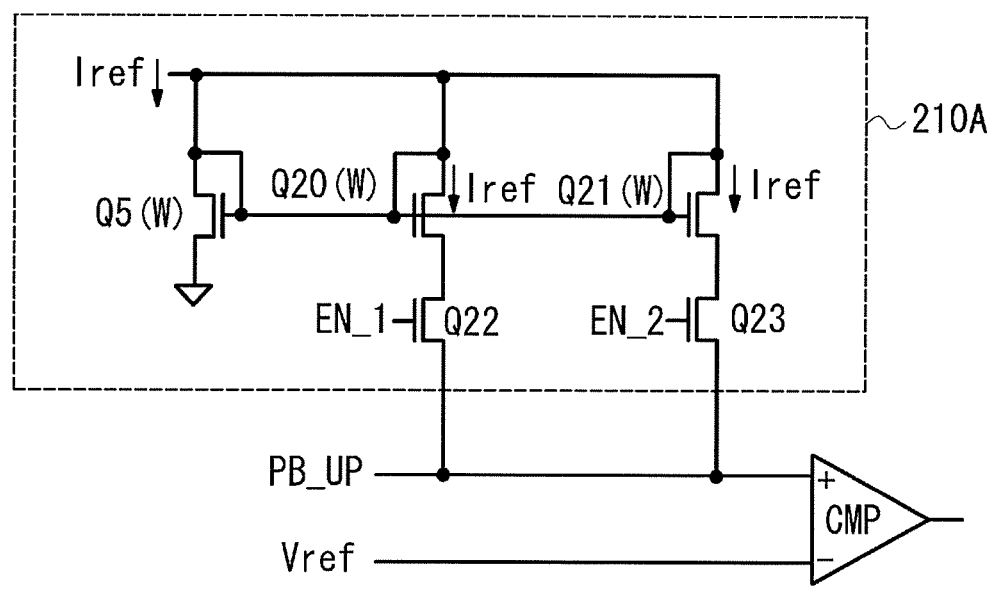
FIG. 15 is a view illustrating a supply circuit according to the third embodiment of the invention.

FIG. 14 is a view illustrating a configuration of a determination circuit 200c according to the third embodiment of the invention. In the determination circuit 200c of the third embodiment, the reference voltage Vref is fixed at the value in of ½ Iref of the transistor Q6. In addition, a supply circuit 210 is connected to the wiring PB_UP. The supply circuit 210 supplies the reference current Iref corresponding to the bit number N for determining the unqualified bits to be suspectedly qualified. The supply circuit 210 may be a current mirror circuit that the same current of the transistor Q5 flows through. As an example, the determination circuit 200C does not supply the reference current Iref using the supply circuit 210 in the case of determining 0 bits of unqualified bits, supplies 1×Iref using the supply circuit 210 in the case of determining 1 bit of unqualified bits, and supplies 2×Iref using the supply circuit 210 in the case of determining 2 bits of unqualified bits. FIG. 15 is a view illustrating an example of the supply circuit. A supply circuit 210A includes the transistor Q5 and a transistor Q20 and a transistor Q21 formed by the current mirror. The transistor Q20 and the transistor Q21 are respectively in serial connection with a transistor Q22 and a transistor Q23. The transistor Q22 and the transistor Q23 are driven by the enable signal EN_1 and the enable signal EN_2. When the wiring PB_UP supplies 2×Iref, the enable signals EN_1 and EN_2 are driven to the H potential, when the wiring PB_UP supplies 1×Iref, one of the enable signals EN_1 and EN_2 is driven to the H potential, and when no Iref is supplied, the enable signals EN_1 and EN_2 are driven to the L potential.

Table 4 provides current values of the respective parts when the determination circuit of the second embodiment determines 0 bits, 1 bit, or 2 bits of unqualified bits to be suspectedly qualified or not.

TABLE 4

| Suspectedly qualified | Qualified or not | Iref(Vref) | Iref(PB_UP) | ΔIref |
|---|---|---|---|---|
| 0 bits | Qualified | Iref/2 | 0Iref − 0Iref(0 bits unqualified) | +Iref/2 |
|  | Unqualified |  | 1Iref − 0Iref(1 bit unqualified •) | −Iref/2 |
| 1 bit | Qualified |  | 1Iref − 1Iref(1 bit unqualified) | +Iref/2 |
|  | Unqualified |  | 2Iref − 1Iref(2 bits unqualified) | −Iref/2 |
| 2 bits | Qualified |  | 2Iref − 2Iref(2 bits unqualified) | +Iref/2 |
|  | Unqualified |  | 3Iref − 2Iref(3 bits unqualified) | −Iref/2 |

(1) The Case of Determining 0 Bit of Unqualified Bits:
Whether the programming of all the bits succeeds is determined, and the reference voltage Vref is fixed at a value of the current flowing through the transistor Q6 dropping by ½ Iref+2×Iref. Besides, since the transistor Q1 is disconnected, the voltage of the wiring PB_UP does not change. Consequently, the comparator CMP outputs the H potential (qualified). In the case that one bit of unqualified bits is present, due to the transistor Q2, the voltage of the wiring PB_UP may drop by Ira and become lower than the reference voltage Vref. Therefore, the comparator CMP outputs the L potential (unqualified).

(2) The Case of Determining 1 Bit of Unqualified Bits:
Similarly, since ½ Iref flows through the transistor Q6, the reference voltage Vref is fixed. The supply circuit 210 supplies the wiring PB_UP the current of Iref. Regarding the voltage of the wiring PB_UP when one bit of unqualified bits is present, even though Iref flows through the transistor Q2, the released current is canceled by the supplied current, because the supply circuit 210 supplies Iref. Thus, the voltage of the wiring PB_UP does not change. Thus, the voltage of the wiring PB_UP becomes higher than the reference voltage Vref, and the comparator CMP outputs the H potential indicating qualified. Regarding the voltage of the wiring PB_UP when two bits of unqualified bits are present, 2×Iref flows through the transistor Q2, and the supply circuit 210 supplies Iref. Thus, the voltage of the wiring PB_UP drops by Iref and becomes lower than the reference voltage Vref. Therefore, the comparator CMP outputs the L potential indicating unqualified.

(3) The Case of Determining 2 Bits of Unqualified Bits:
½ Iref flows through the transistor Q6, and the reference voltage Vref is fixed. The supply circuit 210 supplies the wiring PB_UP 2×Iref. Regarding the voltage of the wiring PB_UP when two bits of unqualified bits are present, even though 2×Iref flows through the transistor Q2, the current released is canceled by the supplied current because the supply circuit 210 supplies 2×Iref. Thus, the voltage of the wiring PB_UP does not change. Thus, the voltage of the wiring PB_UP becomes higher than the reference voltage Vref, and the comparator CMP outputs the H potential indicating qualified. Regarding the voltage of the wiring PB_UP when three bits of unqualified bits are present, 3×Iref flows through the transistor Q2, and the supply circuit 210 supplies 2×Iref. Thus, the voltage of the wiring PB_UP drops by Iref and becomes lower than the reference voltage Vref. Therefore, the comparator CMP outputs the L potential indicating unqualified.

Figure 16:
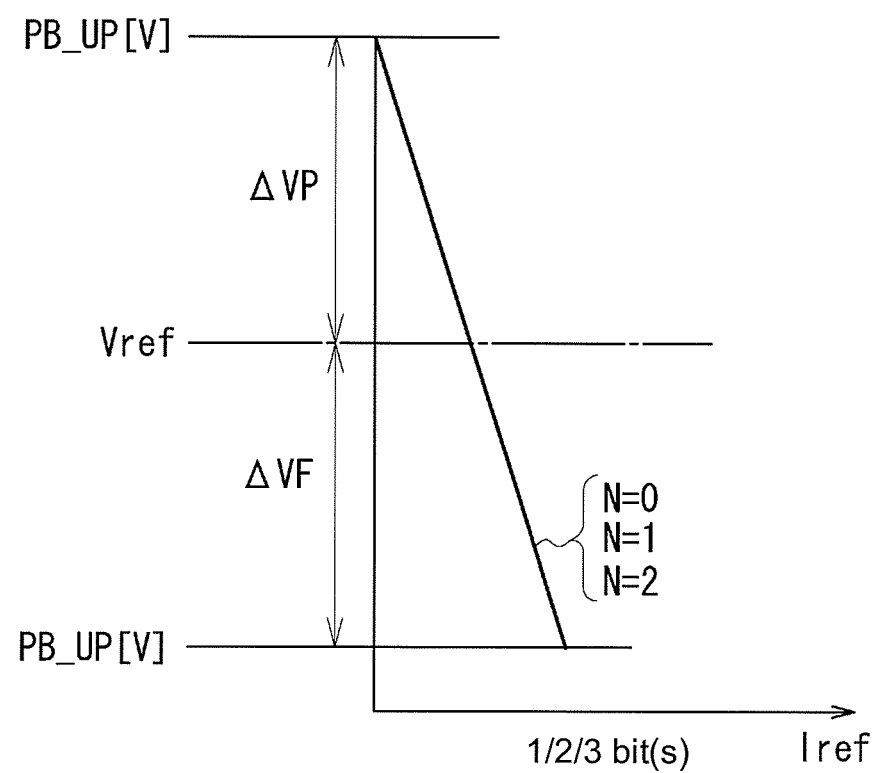
FIG. 16 is a view illustrating a relation between the reference voltage Vref and the voltage of the wiring PB_UP in the determination circuit according to the third embodiment of the invention.

FIG. 16 is a view illustrating a relation between the reference voltage Vref and the voltage of the wiring PB_UP when the determination circuit 200c of the third embodiment determines suspectedly qualified in the case of 0 bit, 1 bit, and 2 bits (N=0, N=1, N=2). In the third embodiment, the wiring PB_UP is supplied with 1×Iref or 2×Iref in the determination of 1 bit of unqualified bits or 2 bits of unqualified bits, so the voltage of the wiring PB_UP does not drop. Consequently, regarding the voltage margin ΔVP and the voltage margin ΔVF, the determination may proceed in the same manner as in the case of the unqualified determination of 0 bits.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A non-volatile semiconductor storage device, comprising:
   a memory array;
   a plurality of page buffer/sensing circuits, wherein in the page buffer/sensing circuits, each of the page buffer/sensing circuits comprises a circuit connected to the memory array through a bit line and holding data to be programmed in a selected page, and an output circuit outputting whether a verification is qualified or not in a programming verification; and a determination circuit, connected to the output circuit of each of the page buffer/sensing circuits, and determining whether verification results of the plurality of page buffer/sensing circuits match a permissible number of unqualified bits, wherein the determination circuit comprises: a first circuit generating a detection voltage corresponding to whether the verifications of the page buffer/sensing circuits are qualified or not, a second circuit generating a reference voltage, and a comparator comparing the detection voltage with the reference voltage, wherein the comparator outputs a signal indicating whether the verification results of the page buffer/sensing circuits are the permissible number of unqualified bits, wherein the first circuit comprises a supply circuit, and the supply circuit supplies the reference currents in an amount corresponding to the permissible number of unqualified bits, and the detection voltage generated by the first circuit is at a value corresponding to the reference currents supplied by the supply circuit, wherein the second circuit comprises a plurality of transistors that the reference current flows through, and the second circuit selects a number of operable transistors of the transistors in correspondence with the permissible number of unqualified bits.

2. The non-volatile semiconductor storage device as claimed in claim 1, wherein the second circuit generates the reference voltage corresponding to the permissible number of unqualified bits.

3. The non-volatile semiconductor storage device as claimed in claim 2, wherein the second circuit generates the reference voltage based on reference currents corresponding to the permissible number of unqualified bits.

4. The non-volatile semiconductor storage device as claimed in claim 3, wherein the output circuit of the data holding circuit comprises a transistor that a current equivalent to the reference current of the second circuit when the result of the verification is unqualified flows through, and the first circuit generates the detection voltage based on the reference currents corresponding to the number of unqualified bits.

5. The non-volatile semiconductor storage device as claimed in claim 1, wherein the second circuit generates the reference voltage with the reference currents in a predetermined amount, and the first circuit generates the detection voltage based on the reference currents in an amount less than the predetermined amount.

6. The non-volatile semiconductor storage device as claimed in claim 1, wherein the supply circuit comprises a plurality of transistors that the reference current flows through, and the supply circuit selects the number of operable transistors of the transistors in correspondence with the permissible number of unqualified bits.

7. The non-volatile semiconductor storage device as claimed in claim 1, wherein the permissible number of unqualified bits is determined in correspondence with the number of bits that are able to be repaired by an error checking and correction member.

8. The non-volatile semiconductor storage device as claimed in claim 7, wherein when the error checking and correction member operates using a sector of the selected page as a unit, the determination circuit is connected to the page buffer/sensing circuits using the sector as a unit.

9. A non-volatile semiconductor storage device, comprising:

a memory array;

a plurality of page buffer/sensing circuits, wherein in the page buffer/sensing circuits, each of the page buffer/sensing circuits comprises a circuit connected to the memory array through a bit line and holding data to be programmed in a selected page, and an output circuit outputting whether a verification is qualified or not in a programming verification; and a determination circuit, connected to the output circuit of each of the page buffer/sensing circuits, and determining whether verification results of the plurality of page buffer/sensing circuits match a permissible number of unqualified bits, wherein the determination circuit comprises: a first circuit generating a detection voltage corresponding to whether the verifications of the page buffer/sensing circuits are qualified or not, a second circuit generating a reference voltage, and a comparator comparing the detection voltage with the reference voltage, wherein the comparator outputs a signal indicating whether the verification results of the page buffer/sensing circuits are the permissible number of unqualified bits, wherein the first circuit comprises a supply circuit, and the supply circuit supplies the reference currents in an amount corresponding to the permissible number of unqualified bits, and the detection voltage generated by the first circuit is at a value corresponding to the reference currents supplied by the supply circuit, and the permissible number of unqualified bits is determined in correspondence with the number of bits that are able to be repaired by an error checking and correction member, wherein the second circuit comprises a plurality of transistors that the reference current flows through, and the second circuit selects a number of operable transistors of the transistors in correspondence with the permissible number of unqualified bits.

* * * * *